(12) United States Patent
Coleman

(10) Patent No.: US 7,307,475 B2
(45) Date of Patent: Dec. 11, 2007

(54) RF GENERATOR WITH VOLTAGE REGULATOR

(75) Inventor: Charles Coleman, Fort Collins, CO (US)

(73) Assignee: IXYS Corporation, Santa Clara, CA (US)

( * ) Notice: Subject to any disclaimer, the term of this patent is extended or adjusted under 35 U.S.C. 154(b) by 173 days.

(21) Appl. No.: 11/140,493

(22) Filed: May 26, 2005

(65) Prior Publication Data

US 2005/0270097 A1 Dec. 8, 2005

Related U.S. Application Data

(60) Provisional application No. 60/575,435, filed on May 28, 2004.

(51) Int. Cl.
*H03F 3/217* (2006.01)

(52) U.S. Cl. .................... 330/251; 330/146

(58) Field of Classification Search ............. None
See application file for complete search history.

(56) References Cited

U.S. PATENT DOCUMENTS

| | | | |
|---|---|---|---|
| 4,884,168 A | 11/1989 | August et al. | |
| 5,088,005 A | 2/1992 | Ciaccio et al. | |
| 5,287,919 A | 2/1994 | George et al. | |
| 5,424,614 A | 6/1995 | Maheshwari | |
| 5,559,467 A * | 9/1996 | Smedley | 330/10 |
| 5,903,583 A | 5/1999 | Ullman et al. | |
| 6,034,489 A | 3/2000 | Weng | |
| 6,064,584 A | 5/2000 | Cornec et al. | |
| 6,072,362 A | 6/2000 | Lincoln et al. | |
| 6,133,788 A | 10/2000 | Dent et al. | |
| 6,137,233 A | 10/2000 | Moisin | |
| 6,246,599 B1 | 6/2001 | Jang et al. | |
| 6,380,694 B1 | 4/2002 | Uchihashi et al. | |
| 6,469,919 B1 | 10/2002 | Bennett | |
| 7,102,431 B2 * | 9/2006 | Bier | 330/251 |

(Continued)

FOREIGN PATENT DOCUMENTS

DE 19514544 A1 10/1996

(Continued)

OTHER PUBLICATIONS

Coleman, C., U.S. Appl. No. 11/140,609 for "RF Generator with Commutation Inductor," filed Mar. 26, 2005.

(Continued)

*Primary Examiner*—Khanh Van Nguyen
(74) *Attorney, Agent, or Firm*—Townsend & Townsend & Crew LLP

(57) ABSTRACT

A radio frequency (RF) generator includes a first half bridge including first and second power transistors; a second half bridge including first and second power transistors; an output node coupling the first and second half bridges and RF signals to a load; positive and negative rails coupled to an AC power source via a rectifier; a first blocking capacitor provided between the positive rail and the load; a second blocking capacitor provided between the negative rail and the load; and a voltage regulator configured to output a given voltage to the first and second bridges, wherein the first and second blocking capacitors are configured to isolate the load from the AC power source.

18 Claims, 6 Drawing Sheets

U.S. PATENT DOCUMENTS

| | | |
|---|---|---|
| 2001/0004312 A1 | 6/2001 | Miyajima et al. |
| 2002/0097085 A1 | 7/2002 | Stapleton |
| 2004/0145584 A1 | 7/2004 | Lee et al. |
| 2004/0228153 A1 | 11/2004 | Cao et al. |

FOREIGN PATENT DOCUMENTS

| | | |
|---|---|---|
| EP | 508717 A | 10/1992 |
| JP | 09-102568 A1 | 5/1997 |
| WO | WO98/37627 A1 | 8/1998 |
| WO | WO 01/95688 A1 | 12/2001 |

OTHER PUBLICATIONS

Coleman, C., U.S. Appl. No. 11/140,404, for "RF Generator with Reduced Size and Weight," filed May 27, 2005.

Coleman, C., U.S. Appl. No. 11/139,273 for "RF Generator with Phase Controlled Mosfets," May 27, 2005.

* cited by examiner

RF GENERATOR WITH VOLTAGE REGULATOR

BACKGROUND OF THE INVENTION

The present applications claims the benefit of U.S. Provisional Patent Application No. 60/575,435, filed on May 28, 2004, which is incorporated by reference.

BACKGROUND OF THE INVENTION

The present invention relates to an radio frequency (RF) generator with a voltage regulator.

A power amplifier or generator is a circuit for converting DC-input power into a significant amount of RF/microwave output power. There is a great variety of different power amplifiers (PAs). A transmitter contains one or more PAs, as well as ancillary circuits such as signal generators, frequency converters, modulators, signal processors, linearizers, and power supplies. As used herein, the terms "power generator," "RF generator," and "power amplifier" are used interchangeably.

Frequencies from very low frequency (VLF) through millimeter wave (MMW) are used for communication, navigation, and broadcasting. Output powers vary from 10 mW in short-range unlicensed wireless systems to 1 MW in long-range broadcast transmitters. PAs and transmitters are also used in systems such as radar, RF heating, plasma generation, laser drivers, magnetic-resonance imaging, and miniature DC/DC converters.

RF power amplifiers are commonly designated into various different classes, i.e., classes A–F. Classes of operation differ in the method of operation, efficiency, and power-output capability. The power-output capability (or transistor utilization factor) is defined as output power per transistor normalized for peak drain voltage and current of 1 V and 1 A, respectively.

FIG. 1 illustrates a basic single-ended power amplifier 100. The power amplifier includes an active device 102, DC feed 104, and output filter/matching network 106. FIGS. 2A–2F illustrate drain voltage and current waveforms of selected ideal power amplifiers. FIG. 2A illustrates a wave form for a class A device. FIG. 2B illustrates a wave form for a class B device, and so on.

Generally, RF power amplifiers utilize a wide variety of active devices, including bipolar-junction transistors (BJTs), MOSFETs, JFETs (SITs), GaAs MESFETs, HEMTs, pHEMTs, and vacuum tubes. The power-output capabilities range from tens of kilowatts for vacuum tubes to hundreds of watts for Si MOSFETs at HF and VHF to hundreds of milliwatts for InP HEMTs at MMW frequencies. Depending upon frequency and power, devices are available in packaged, chip, and MMIC form. RF-power transistors generally are n-p-n or n-channel types because the greater mobility of electrons (versus holes) results in better operation at higher frequencies.

While the voltages and currents differ considerably, the basic principles for power amplification are common to all devices. In class-A amplification, the transistor is in the active region at all times and acts as a current source controlled by the gate drive and bias. The drain-voltage and drain-current waveforms are sinusoids, as shown in FIG. 2A. This results in linear amplification. The DC-power input is constant, and the instantaneous efficiency is proportional to the power output and reaches 50% at PEP. For amplification of amplitude-modulated signals, the quiescent current can be varied in proportion to the instantaneous signal envelope. The utilization factor is ⅛. Class A offers high linearity, high gain, and operation close to the maximum operating frequency of the transistor.

FIG. 2B illustrates drain voltage and current waveforms of a class B device. The gate bias in this device is set at the threshold of conduction. The transistor is active half of the time, and the drain current is a half-sinusoid. Since the amplitude of the drain current is proportional to drive amplitude, class B provides linear amplification. For low-level signals, class B is significantly more efficient than class A, and its average efficiency can be several times that of class A at high peak-to-average ratios (e.g., 28% versus 5% for $\xi=10$ dB). The utilization factor is the same as in class A, i.e., ⅛. Class B is widely used in broad-band transformer-coupled PAs operating at HF and VHF.

FIG. 2C illustrates drain voltage and current waveforms of a class C device. The gate of a conventional class-C device is biased below threshold, so that the transistor is active for less than half of the RF cycle. Linearity is lost, but efficiency can be increased arbitrarily toward 100% by decreasing the conduction angle toward zero. This causes the output power (utilization factor) to decrease toward zero and the drive power to increase toward infinity. A typical compromise is a conduction angle of 150° and an ideal efficiency of 85%. When it is driven into saturation, efficiency is stabilized, and the output voltage is locked to supply voltage.

FIG. 2D illustrates drain voltage and current waveforms of a class D device. Class-D devices use two or more transistors as switches to generate square drain-voltage (or current) waveforms. A series-tuned output filter passes only the fundamental-frequency component to the load, resulting in a power outputs of $(8/\pi^2)V^2_{DD}/R$ for the transformer-coupled configuration. Current is drawn generally only through the transistor that is on, resulting in a 100% efficiency for an ideal power amplifier. The utilization factor ($1/2\pi=0.159$) is the highest of the different classes of power amplifiers. If the switching is sufficiently fast, efficiency is not degraded by reactance in the load.

Generally, class-D devices suffer from losses due to saturation, switching speed, and drain capacitance. Finite switching speed causes the transistors to be in their active regions while conducting current. Drain capacitances are charged and discharged generally once per RF cycle, resulting in power loss that is proportional and increases directly with frequency. Class-D devices with power outputs of 100 W to 1 kW are readily implemented at HF.

FIG. 2E illustrates drain voltage and current waveforms of a class E device. Class E employs a single transistor operated as a switch. The drain-voltage waveform is the result of the sum of the DC and RF currents charging the drain-shunt capacitance. In optimum class E, the drain voltage drops to zero and has zero slope just as the transistor turns on. The result is an ideal efficiency of 100%, elimination of the losses associated with charging the drain capacitance in class D, reduction of switching losses, and good tolerance of component variation. Optimum class-E operation requires a drain shunt susceptance of 0.1836/R and a drain series reactance 1.15 R. It delivers a power output of $0.577V^2_{DD}/R$ for an ideal power amplifier with a utilization factor of 0.098. Variations in load impedance and shunt susceptance cause the power amplifier to deviate from optimum operation, but the degradations in performance are generally no worse than those for classes A and B.

FIG. 2F illustrates drain voltage and current waveforms of a class F device. Class F boosts both efficiency and output by using harmonic resonators in the output network to shape the drain waveforms. The voltage waveform includes one or more odd harmonics and approximates a square wave, while the current includes even harmonics and approximates a half sine wave. Alternately ("inverse class F"), the voltage can approximate a half sine wave and the current a square wave. As the number of harmonics increases, the efficiency of an ideal power amplifier increases from the 50% (class A) toward unity (e.g., 0.707, 0.8165, 0.8656, 0.9045 for two, three, four, and five harmonics, respectively) and the utilization factor increases from ⅛ toward ½π. The required harmonics arise naturally from nonlinearities and saturation in the transistor. While class F requires a more complex output filter than other power amplifiers, the impedances at the "virtual drain" generally need to be correct at only a few specific frequencies.

Recently, high voltage MOSFETs, e.g., with 500 V or 1000V MOSFETs, have been used in class "C" or "E" operation. However, the class C and E devices are narrow band approaches because the square wave drive pulses require a filter to remove unwanted spectral content. Efficiency is high but power control is difficult. Power control is usually a variable DC power supply which results in slow control of the output power and difficulty in controlling power at low levels. It is possible to drive these classes with a sine wave; however, the turn-on threshold varies with the MOSFET die temperature which will change the conduction angle (pulse width) of the MOSFET, which can be problematic.

In addition, most RF generators use isolated, variable voltage DC power supplies to power the RF power section. The variable DC supply is very large and slow in response if used in high frequency switch mode.

SUMMARY OF THE INVENTION

The present invention relates to an RF generator that has a voltage regular, e.g., a step-up regulator (or boost regulator) or a step-down regulator (or buck regulator). The present RF generator uses a direct off-line RF power section that does not require the use of a variable power supply. Raising or lowering the voltage to a constant level using a boost/buck regulator provides a means of surviving a brownout without loss of output from the RF generator.

The present RF generator also includes MOSFETS in a full bridge configuration, which are operated using phase shift techniques. The MOSFETs receive the DC power from the buck/boost regulator and are configured to handle 300 volts or more, or 500 volts or more, or 600 volts or more, or 1000 volts or more according to applications. The RF generator is configured to operate in a range of 5 MHz to 50 MHz. In the present embodiment, the RF generator is configured to operate at an Industrial Scientific and Medical (ISM) frequency, e.g., 13.56 MHz or 27.12 MHz. In one implementation, the RF generator is a class D device and is configured to operate directly off line.

Generators with phase shift control have been used in recent years at frequencies below 500 KHz. These power supply designs are at much lower frequencies than the present invention, which is in radio frequencies. Generally, it is difficult to increase the operating frequency of bridges. Gate drive becomes very difficult for larger MOSFETs as the operating frequency is raised. The drive current can exceed 10 Ampere peaks for turn-on and turn-off. Unwanted resonances can occur due to the large gate capacitance and very small stray inductances. These unwanted resonances can result in uncontrolled turn-on or off of the MOSFETs and result in failure of devices. At lower frequencies, hard switching at high voltages is not a limiting factor. At high frequency, e.g., 13.56 MHz, hard switching at high voltage is a serious concern as power dissipation becomes excessive. Zero voltage switching becomes a preferred design. This operation is difficult to maintain over the full operating range of a power stage when phase is shifted.

The present embodiments use one or more commutation inductors to store sufficient energy to provide the energy needed to charge the output capacitance of the MOSFETs and provide RF generators with phase shift control. There are various advantages associated such RF generators: (1) may be operated in a broader frequency range, (2) may operate with fixed DC voltages that are not highly filtered, (3) eliminates the need for a variable DC power supply, and (4) may be operated at very low power to full power.

In one embodiment, a radio frequency (RF) generator comprises a first half bridge including first and second power transistors; a second half bridge including first and second power transistors; an output node coupling the first and second half bridges and RF signals to a load; positive and negative rails coupled to an AC power source via a rectifier; a first blocking capacitor provided between the positive rail and the load; and a second blocking capacitor provided between the negative rail and the load. The first and second blocking capacitors are configured to isolate the load from the AC power source.

In one embodiment, a radio frequency (RF) generator includes a first half bridge including first and second power transistors; a second half bridge including first and second power transistors; an output node coupling the first and second half bridges and RF signals to a load; positive and negative rails coupled to an AC power source via a rectifier; a first blocking capacitor provided between the positive rail and the load; a second blocking capacitor provided between the negative rail and the load; and an offline voltage regulator configured to output a given voltage to the first and second bridges, wherein the first and second blocking capacitors are configured to isolate the load from the AC power source, so that the first and second half bridges does not require a variable, isolated DC power supply.

The voltage regulator is a step-up or step-down regulator. The voltage regulator is a buck, boost or buck-boost regulator. The voltage regulator is provided between the AC power source and the first and second half bridges. The voltage regulator receives power from the AC power source. The voltage regulator receives the power directly from the AC power source in one implementation.

The RF generator also includes a plurality of gate drivers to drive the first and second half bridges; a controller to control the gate drivers; and a sensor provided between the first and second bridges and the load, the sensor being configured to determined the voltage level of signals output by the first and second half bridges and send a feedback signal to the controller.

In yet another embodiment, a radio frequency (RF) generator includes a first half bridge including first and second power transistors; a second half bridge including first and second power transistors; an output node coupling the first and second half bridges and RF signals to a load; positive and negative rails coupled to an AC power source via a rectifier; a first blocking capacitor provided between the positive rail and the load; a second blocking capacitor provided between the negative rail and the load; and an offline voltage regulator configured to output a fixed voltage to the first and second half bridges, wherein the first and second blocking capacitors are configured to isolate the load from the AC power source, so that the first and second half bridges do not require a variable, isolated DC power supply, wherein the voltage regulator is configured to raise or lower voltage output to the first and second half bridges during a brownout condition.

DETAILED DESCRIPTION OF THE INVENTION

Figure 1:
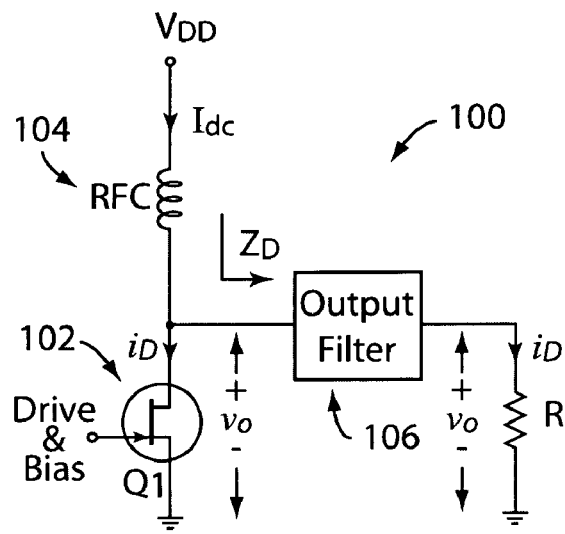
FIG. 1 illustrates a basic single-ended power amplifier.
Figure 2A:
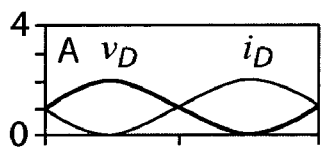
FIG. 2A illustrates a wave form for a class A device.
Figure 2D:
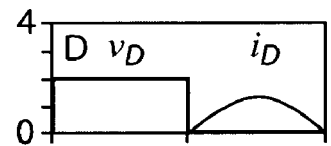
FIG. 2D illustrates drain voltage and current waveforms of a class D device.
Figure 2B:
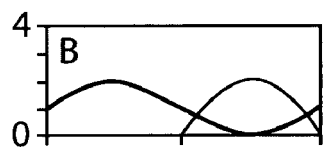
FIG. 2B illustrates drain voltage and current waveforms of a class B device.
Figure 2E:
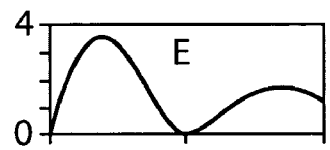
FIG. 2E illustrates drain voltage and current waveforms of a class E device.
Figure 2C:
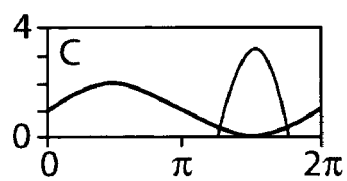
FIG. 2C illustrates drain voltage and current waveforms of a class C device.
Figure 2F:
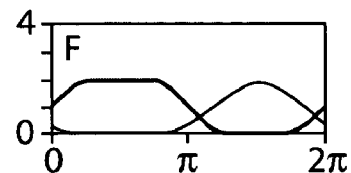
FIG. 2F illustrates drain voltage and current waveforms of a class F device.

The present invention relates to an RF generator that has a full bridge configuration and an offline buck/boost regulator. The offline buck/boost regulator provides a constant voltage in a small form factor with a relatively few parts. It has low stored energy, wide AC input range, and can meet brownout requirements easily. The full bridge configuration comprises high voltage MOSFETs that are operated using phase shift techniques, as disclosed in U.S. patent application Ser. No. 11/140,404, entitled, "RF Generator With Reduced Size and Weight," filed on May 27, 2005, and U.S. patent application Ser. No. 11/140,609, entitled, "RF Generator With Commutation Inductor," filed on May 27, 2005, which are both assigned to the assignee of the present application, and which are both incorporated by reference.

The present embodiment relates to an RF generator operating at an ISM frequency, e.g., 13.56 MHz. The RF generator uses a high voltage phase shift controlled full bridge. A full bridge design offers several advantages which are helpful in RF operation. These include a higher utilization of the MOSFET ratings. In a bridge design, the voltage is limited to the supply rail (e.g., positive rail), whereas it is not the case in a class C or E, and thus must be designed with very large margins in case of reflected power. Another advantage is the drive pulse width is fixed. Phase shift control allows the output power to be controlled by the phase displacement between two half bridges. The two outputs are summed to produce a single output which can be varied from zero to full output power by controlling the phase difference between the two half bridges. This allows power control with fixed supply voltage rails which because of the high operation frequency can be operated directly off line by using blocking capacitors.

One advantage of using a phase shift design is the ability to vary frequency. The high Q circuits used with classes C and E preclude varying frequency by any significant amount. The bridge circuit has a symmetry which results in an ability to adjust and thus reduce second harmonic distortion. This allows for a different output network design which can provide for a wider frequency of operation because it does not require as much attenuation of the second harmonic.

In class C and E devices, the output power is typically control by using a variable DC power supply. This limits the speed at which the output power can be varied to that of the DC power supply. The phase shift control limits the speed at which power can be varied only to the speed at which phase can be varied and the Q of the output network. Phase can be varied at rates of 10 degrees per cycle or more and thus can result in very high speed power control or pulsing.

Another characteristic of the phase shift is improved performance at low power. Conventional designs using class C or E have great difficulty when the power supply voltage is reduced to low levels. This is due to the large capacitances, at low drain voltages, in the MOSFET, allowing gate drive signals to be fed to the output through the Crss capacitance (gate to drain capacitance) and detuning of the output network with the very large increase in the average output capacitance Coss. There are other advantages associated with the present RF generator, as will be appreciated by those skilled in the art.

Figure 3:
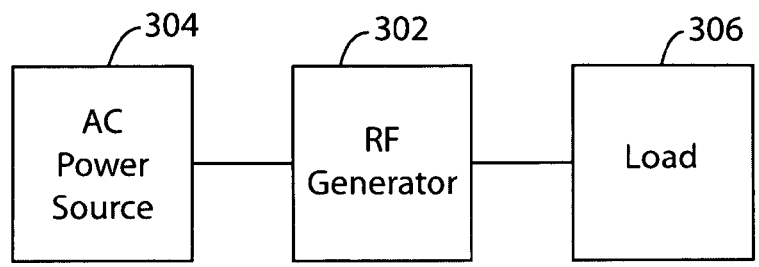
FIG. 3 illustrates an RF generator being coupled to an AC power source and a load.

FIG. 3 illustrates an RF generator 302 being coupled to an AC power source 304 and a load 306. The power source is a typical AC source with a relatively low frequency, e.g., 60 Hz. The load is a device or equipment, e.g., a plasma chamber, that is run using the output generated by the RF generator.

Figure 4:
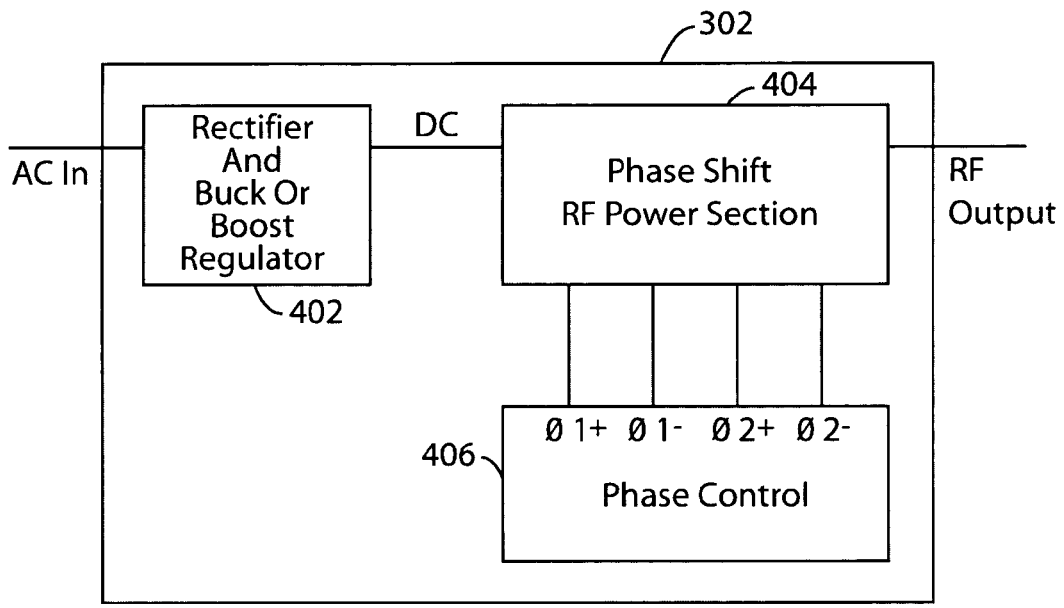
FIG. 4 illustrates a more detailed view of an RF generator according to one embodiment of the present invention.

FIG. 4 illustrates a more detailed view of the RF generator 302 according to one embodiment of the present invention. The RF generator includes a rectifier 402 that receives the AC current and converts it into a DC current. The RF generator uses fixed DC voltages rather than variable DC power supply since phase shift technique is used. Generally, a rectifier includes a bridge configuration to convert 60 Hz to a DC current. A phase shift RF power section 404 receives the DC current and sends out an RF output according to the controls of a phase control 406. The phase control comprises four gate drivers, each driving a MOSFET (see FIG. 5) that is arranged in a full-bridge configuration.

Figure 5:
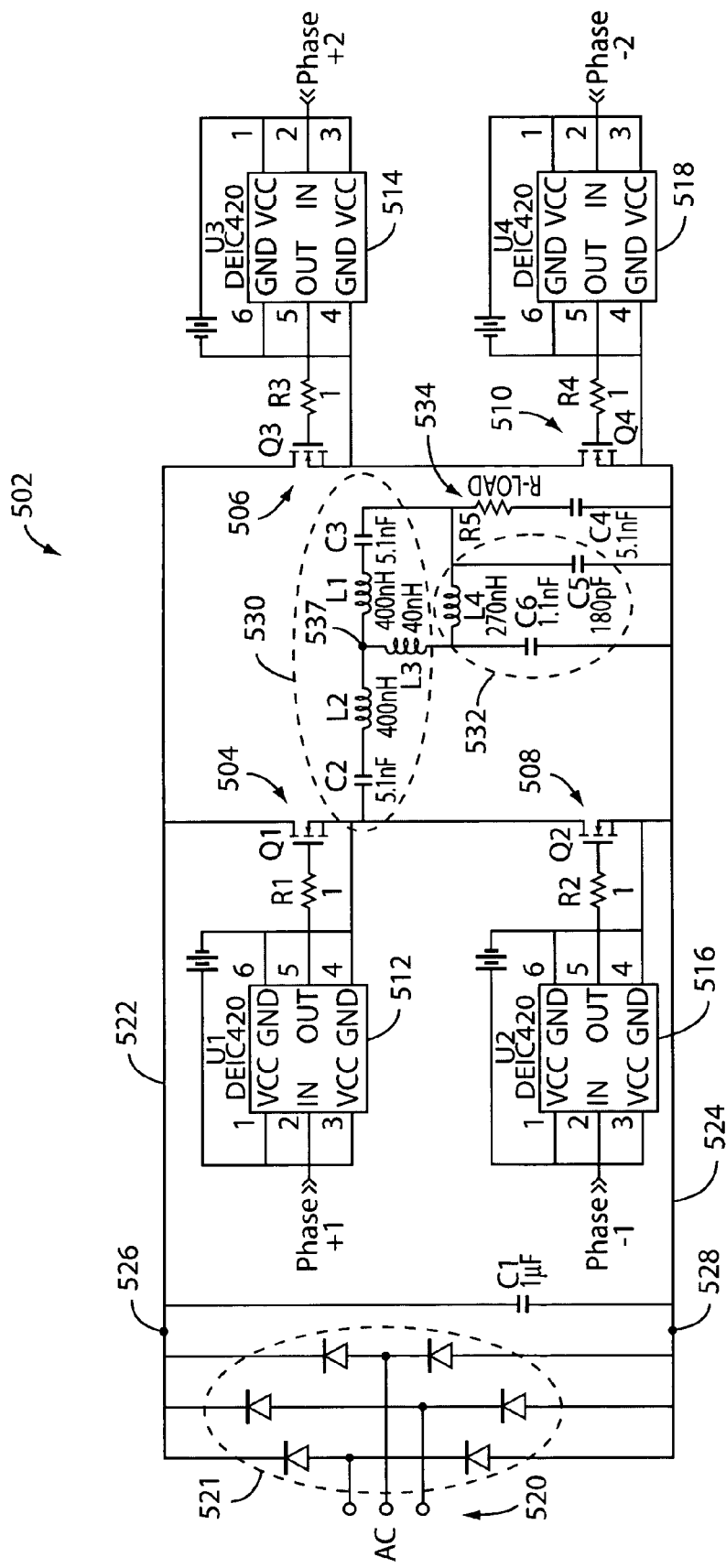
FIG. 5 illustrates an RF generator having a full bridge configuration according to one embodiment of the present invention.

FIG. 5 illustrates an RF generator 502 having a full bridge configuration according to one embodiment of the present invention. The RF generator 502 includes first, second, third and fourth MOSFETs 504, 506, 508, and 510. In the present implementation, the MOSFETs are "IXYS-RF MOSFET IXZ211N50," but other types of power MOSFETs may be used in other implementations. The first and third MOSFETs 504 and 508 define a first half bridge, and the second and fourth MOSFETs 506 and 510 define a second half bridge.

First, second, third, and fourth gate drivers 512, 514, 516, and 518 are coupled to the control terminals of the first, second, third, and fourth MOSFETs, respectively. The MOSFETs are configured to handle at least 500 volts and at least 11 amperes in the present implementation. An AC power source 520 is coupled to a positive rail 522 and a negative rail 524 via a rectifier 521, defining a given potential difference V. The rectifier is provided between the AC power source and nodes 526 and 528 to provide DC currents to the node 526. The DC currents are supplied to the first and second MOSFETs via the positive rail 522. A first capacitor C1 is provided between the positive and negative rails. In the present embodiment, a fixed DC voltage is provided to the first and second MOSFETs.

A resonant circuit 530 is provided between the output nodes of the first and second MOSFETs, so that the RF generator can operate at resonate frequency and avoid hard switching. The circuit 530 includes second and third capacitors C2 and C3, and first, second, and third inductors L1, L2, and L3.

In the present implementation, the second and third capacitors have capacitance of 5.1 nf each. The first and second inductors L1 and L2 have inductance of 400 nH each. The third inductor L3 has inductance of 40 nH. In other implementations, these components may have different values.

The values of the inductors L1 and L2 have been selected to facilitate the commutation of the MOSFETs, such that hard switching is avoided for much of the phase shift range. Hard switching is not completely avoided in the present embodiment because the currents in the inductors are not identical as phase shift is varied. One of the half bridges would have a reduced current as the phase is changed from zero of 180 degrees. The reduction in current results in only a partial resonant commutation with the remainder being hard switching.

An impedance matching circuit 532 is provided between the resonate circuit 530 and a load 534 that is represented as a resistor R5. The matching circuit includes a fourth inductor L4 and fifth and sixth capacitors C5 and C6.

In the present implementation, the fourth inductor has inductance of 270 nH. The fifth and sixth capacitors C5 and C6 have capacitance of 180 pf and 1.1 nf, respectively. These components may have different values in different implementations.

The RF generator 502 also includes a plurality of blocking capacitors C2, C3, and C4 to isolate the load 534 from the power section and operate the RF generator directly off line. The blocking capacitor or fourth capacitor C4 has capacitance of 5.1 nf in the present implementation but may have other values in other implementations.

Figure 6:
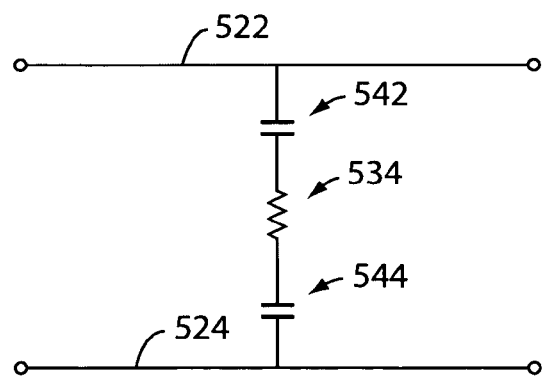
FIG. 6 illustrates a blocking capacitor that is provided between the positive rail and the load.

To operate directly offline, at least two blocking capacitors are used. That is, at least one blocking capacitor 542 is provided between the positive rail 522 and the load 534, as shown in FIG. 6. The capacitor 542 corresponds to the blocking capacitor C2 or C3. At least another blocking capacitor 544 is provided between the negative rail 544 and the load 534. The capacitor 544 corresponds to the blocking capacitor C4. The great difference in frequency between the very high output frequency (e.g., 13.56 MHz) and the very low input frequency (e.g., 60 Hz) of the AC power source 520 enables the use of low frequency blocking capacitors C2, C3, and C4 to isolate the load from the power section. This allows the output to be grounded without excessive current flow from the 60 Hz power In operation, the phase of the two half bridges of the RF generator 502 is varied to control the power output. The output of the two half bridges are combined using a network to sum the outputs into a single node 537. The single node is then impedance matched to the output using the matching circuit 532.

Figure 7A:
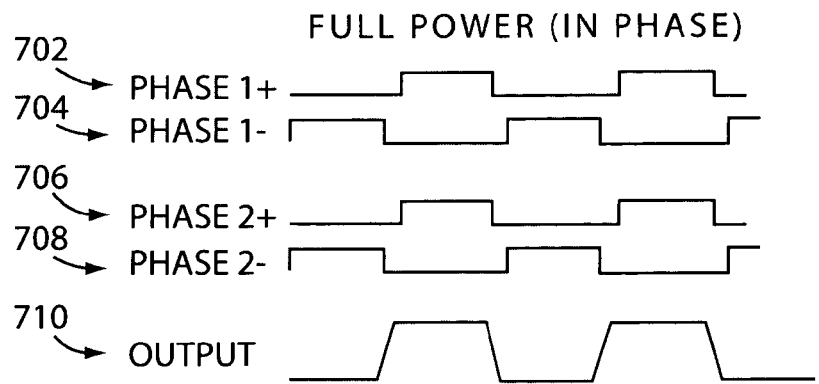
FIG. 7A illustrates the waveforms when the half bridges are controlled to output full power.
Figure 7B:
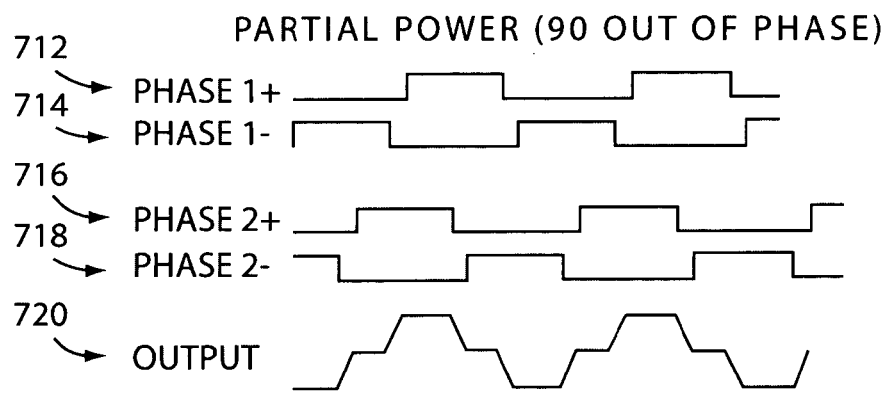
FIG. 7B illustrates the waveforms when the MOSFETs are operated at about 90 degrees out of phase.
Figure 7C:
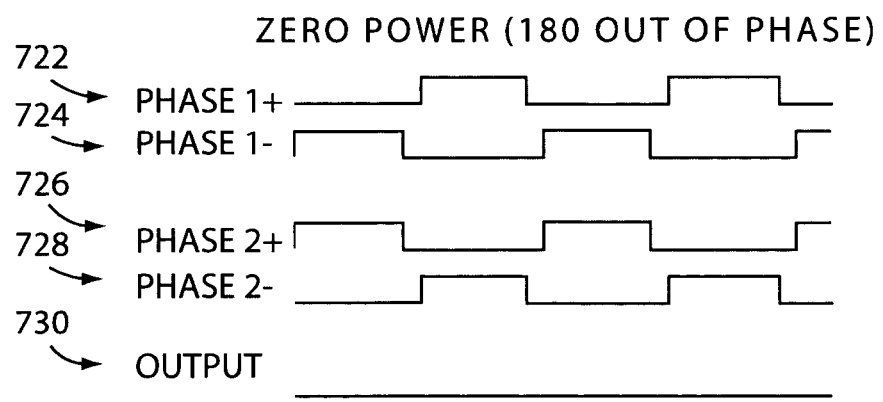
FIG. 7C illustrates the waveforms when the MOSFETs are operated at 180 degrees out of phase.

FIGS. 7A–7C illustrate the waveforms generated by the RF generator 502 according to the present embodiment. These waveforms are illustrated as quasi-square waves for illustrative convenience. However, they are in reality closer to sine waves due to the filtering of the total network.

FIG. 7A illustrates the waveforms when the half bridges are controlled to output full power. A zero degree phase relationship is maintained for this operation. A first waveform 702 illustrates the output of the MOSFET 504, and a second waveform 704 illustrates the output of the MOSFET 508. Similarly, a third waveform 706 illustrates the output of the MOSFET 506, and a fourth waveform 708 illustrates the output of the MOSFET 510. An output waveform 710 illustrates the power output of the RF generator that results from combining the outputs of the above MOSFETs. Since the MOSFETs are operated in phase, full power is output. The node 537 switches at full pulse widths similar to the drive waveforms.

FIG. 7B illustrates the waveforms when the MOSFETs are operated at about 90 degrees out of phase. A first waveform 712 illustrates the output of the MOSFET 504, and a second waveform 714 illustrates the output of the MOSFET 508. Similarly, a third waveform 716 illustrates the output of the MOSFET 506, and a fourth waveform 718 illustrates the output of the MOSFET 510. An output waveform 720 illustrates the output of the RF generator that results from combining the outputs of the above MOSFETs. The power output is lower since the MOSFETs are not being operated in phase, as shown by the smaller pulses.

FIG. 7C illustrates the waveforms when the MOSFETs are operated at 180 degrees out of phase. A first waveform 722 illustrates the output of the MOSFET 504, and a second waveform 724 illustrates the output of the MOSFET 508. Similarly, a third waveform 726 illustrates the output of the MOSFET 506, and a fourth waveform 728 illustrates the output of the MOSFET 510. An output waveform 730 illustrates the output of the RF generator that results from combining the outputs of the above MOSFETs. Since the MOSFETs operated 180 degrees out of phase, no power is output.

Although there is no power output when the MOSFETs are operated in 180 degrees out of phase, currents continue to flow through the inductors L1 and L2. These inductors are being charged and discharged. The potential of the node 537, however, does not change and remains at the same level. This is so since the inductors L1 and L2 are a voltage divider, each with the same inductance. The node 537 remains at V/2 (i.e., a half of the potential difference between the positive and negative rails 522 an 524) as long as the drive is symmetrical.

Figure 8:
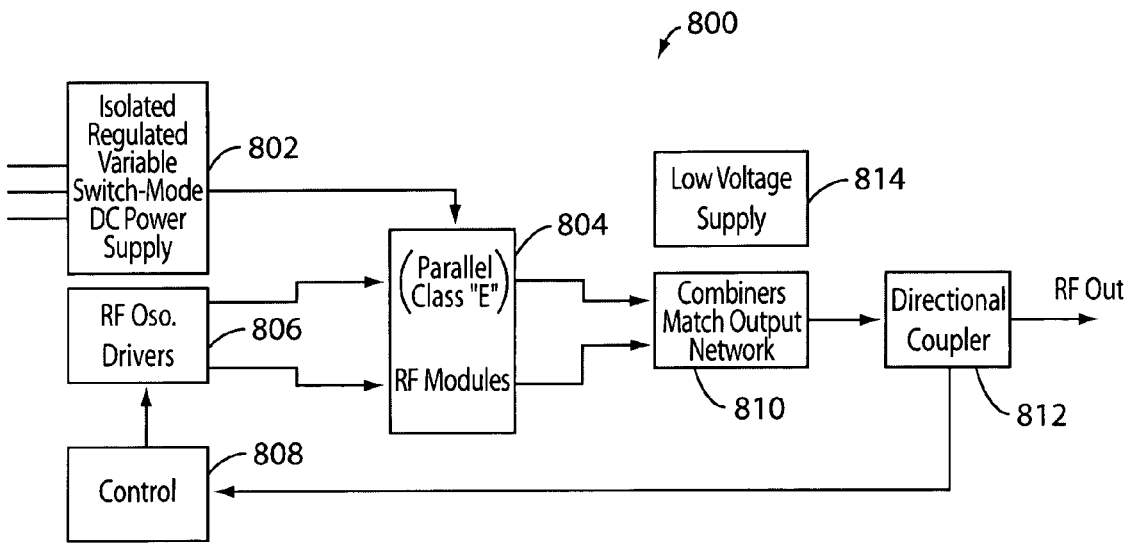
FIG. 8 illustrates an RF generator including a variable DC power supply.

FIG. 8 illustrates an RF generator 800 including a variable DC power supply 802. The DC power supply is an isolated regulated variable switch-mode power supply that is coupled to an AC power source via a rectifier (not shown). The variable DC power supply is used to provide a constant voltage output. Generally, voltages supplied by an AC power supply vary within a given range. For example, if a country uses 220 volts, the voltage supplied may vary between a minimum voltage of 180 volts to a maximum voltage of 240. The variable DC power supply can be used to step-up or step-down the voltage received from the AC power supply. In addition, the variable DC power supply enables the RF generator to be used in countries with different voltage requirements, so that a given RF generator design can be used in different countries by just reconfiguring the variable DC power supply.

The RF generator 800 also includes a plurality of RF modules (or MOSFETs) 804 in a full bridge configuration. The RF modules provide a class E device. The RF modules receive the DC power output by the DC power supply 802. A plurality of RF drivers 806 coupled to the control terminals of the MOSFETs drive the MOSFETs. A control device 808 controls the RF drivers 806. A matching output network 810 receives the RF signals output by the RF modules 804 to enable resonant operation and impedance tuning.

A sensor 812 receives the RF signals that have been tuned and determines the power level. The sensor 812 sends a feedback signal to the control device 808 based on the power level that has been determined. The control device 808 uses the feedback signals to control the RF drivers, so that the power level of the RF signals output by the RF modules can be increased or decreased to maintain a constant power level. A voltage supply 814 supplies power to the components in the RF generator 800. One problem with the variable DC power supply is its complexity and large size. Accordingly, the use of variable, isolated DC power supply significantly increases the size of the RF generator.

Figure 9:
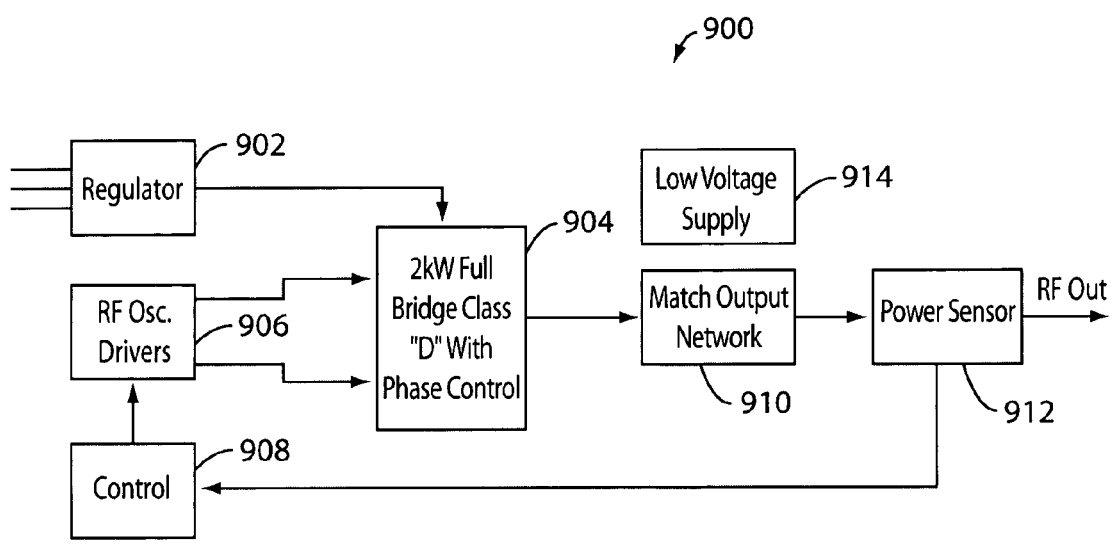
FIG. 9 illustrates an RF generator with a voltage regulator according to one embodiment of the present invention.

FIG. 9 illustrates an RF generator 900 with a voltage regulator 902 according to one embodiment of the present invention. The voltage regulator 902 may be a boost regulator or buck regulator. In one implementation, the voltage regulator is a boost-buck regulator. The RF generator 900 uses a direct off-line approach. A plurality of blocking capacitors (not shown) are provided to isolate the AC power supply from the load (see FIGS. 5 and 6). Accordingly, a transformer is not needed to interface with the AC power source.

The use of a direct-off line RF power section such as a phase controlled full bridge which does not require a variable power supply enables the use of a boost regulator (or buck regulator). Raising the voltage to a constant level using a boost regulator provides means of surviving a brownout without a loss of output from the RF generator. Similarly, a buck regulator can be used to reduce the voltage to a level below that expected during a brownout can be used to ensure continued output from the RF generator.

The voltage regulator 902 sends its output to a plurality of MOSFETs 904 in a full bridge configuration (see FIG. 5). The MOSFETs define a class D device in the present implementation. The MOSFETs receive the DC power output by the voltage regulator 902. A plurality of RF drivers 906 coupled to the control terminals of the MOSFETs drive the MOSFETs. A controller 908 controls the RF drivers 906. A matching output network 910 receives the RF signals output by the MOSFETs to enable resonant operation and impedance tuning.

A sensor 912 receives the RF signals that have been tuned and determines the power level. The sensor 912 sends a feedback signal to the controller 908 based on the power level that has been determined. The controller 908 uses the feedback signals to control the RF drivers, so that the level of the RF signals output by the RF modules can be increased or decreased to maintain a constant power level. A voltage supply 914 supplies power to the components in the RF generator 900.

Figure 10:
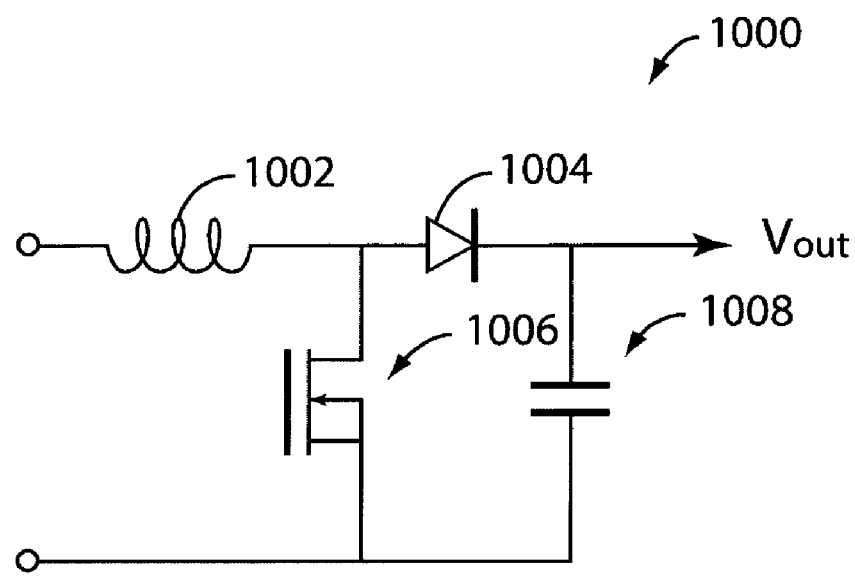
FIG. 10 illustrates an exemplary boost regulator according to one embodiment of the present invention.

FIG. 10 illustrates an exemplary boost regulator 1000 according to one embodiment of the present invention. The boost regulator 1000 includes an inductor 1002 and a diode 1004 in series. The output is sent to the RF section, e.g., to the MOSFETs in a full bridge configuration, via the diode.

A transistor or MOSFET 1006 and a capacitor 1008 are provided in parallel and are connected to one end of the diode, respectively.

Figure 11:
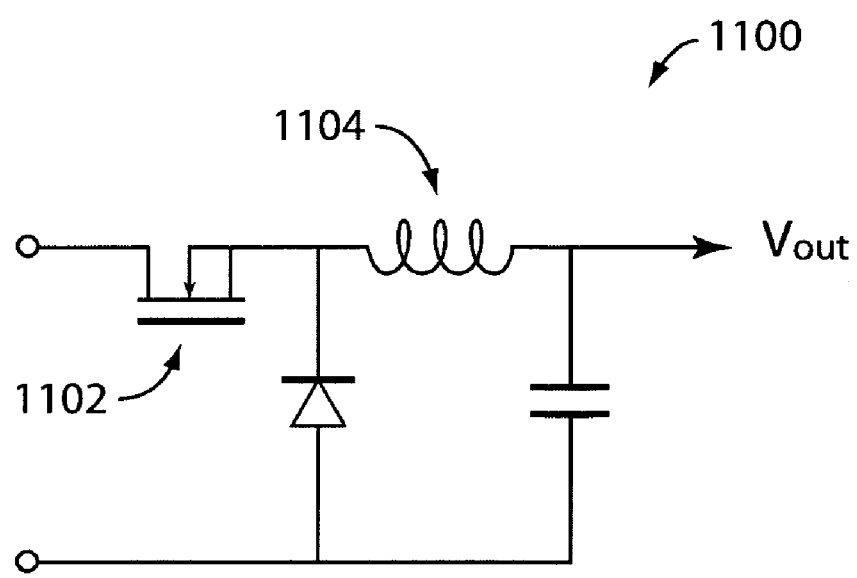
FIG. 11 illustrates an exemplary buck regulator according one embodiment of the present invention.

FIG. 11 illustrates an exemplary buck regulator 1100 according one embodiment of the present invention. The buck regulator includes a transistor or MOSFET 1102 and an inductor 1104 in series. A diode 1106 and a capacitor 1108 are provided in parallel and are connected to each end of the diode, respectively. The output is sent to the RF section via the inductor.

The present invention has been illustrated in terms of specific embodiments to fully disclose and enable the invention. The embodiments disclosed above may be modified or varied without departing from the scope of the present invention. The description and drawings provided herein, therefore, should not be used to limit the scope of the present invention.

What is claimed is:

1. A radio frequency (RF) generator, comprising:
   a first half bridge including first and second power transistors;
   a second half bridge including first and second power transistors;
   an output node coupling the first and second half bridges and RF signals to a load;
   positive and negative rails coupled to an AC power source via a rectifier;
   a first blocking capacitor provided between the positive rail and the load;
   a second blocking capacitor provided between the negative rail and the load; and
   an offline voltage regulator configured to output a given voltage to the first and second bridges,
   wherein the first and second blocking capacitors are configured to isolate the load from the AC power source, so that the first and second half bridges do not require a variable, isolated DC power supply.

2. The RE generator of claim 1, wherein the voltage regulator is a step-up or step-down regulator, where the first and second power transistors are MOSFETs, and the third and fourth power transistors are MOSFETs.

3. The RF generator of claim 1, wherein the voltage regulator is provided between the AC power source and the first and second half bridges, where the RF generator is configured to operate at an Industrial Scientific and Medical (ISM) frequency.

4. The RF generator of claim 3, wherein the RF generator is configured to operate at 13.56 MHz or 27.12 MHz.

5. The RF generator of claim 3, wherein the voltage regulator receives power from the AC power source.

6. The RF generator of claim 1, further comprising:
   a resonant circuit provided between the first and second half bridges.

7. The RF generator of claim 6, wherein resonant circuit includes first, second, and third inductors.

8. The RF generator of claim 1, further comprising:
   a plurality of gate drivers to drive the first and second half bridges;
   a controller to control the gate drivers; and
   a sensor provided between the first and second bridges and the load, the sensor being configured to determined the power level of signals output by the first and second half bridges and send a feedback signal to the controller.

9. The RF generator of claim 1, further comprising:
   a matching network provided between the resonant circuit and the load.

10. The RF generator of claim 1, further comprising:
a third blocking capacitor provided between the positive rail and the load.

11. The RF generator of claim 10, further comprising:
a resonant circuit provided between the first and second half bridges, wherein the first and third blocking capacitors are part of the resonant circuit.

12. The RF generator of claim 11, wherein the first blocking capacitor is proximate the first half bridge, and the second blocking capacitor is proximate the second half bridge.

13. The RF generator of claim 12, wherein the first and second blocking capacitors have substantially the same capacitance.

14. The RF generator of claim 1, wherein the voltage regulator is a step-up or step-down regulator that outputs a fixed voltage.

15. A radio frequency (RF) generator, comprising:
a first half bridge including first and second power transistors;
a second half bridge including first and second power transistors;
an output node coupling the first and second half bridges and RF signals to a load;
positive and negative rails coupled to an AC power source via a rectifier;
a first blocking capacitor provided between the positive rail and the load;
a second blocking capacitor provided between the negative rail and the load; and
an offline voltage regulator configured to output a fixed voltage to the first and second half bridges,
wherein the first and second blocking capacitors are configured to isolate the load from the AC power source, so that the first and second half bridges do not require a variable, isolated DC power supply,
wherein the voltage regulator is configured to raise or lower voltage output to the first and second half bridges during a brownout condition.

16. The RF generator of claim 15, further comprising:
a plurality of gate drivers to drive the first and second half bridges;
a controller to control the gate drivers; and
a sensor provided between the first and second bridges and the load, the sensor being configured to determined the power level of signals output by the first and second half bridges and send a feedback signal to the controller.

17. The RF generator of claim 15, wherein the voltage regulator receives AC currents from the AC power source.

18. The RF generator of claim 15, further comprising:
a third blocking capacitor provided between the positive rail and the load.

* * * * *